(12) United States Patent
Cho et al.

(10) Patent No.: US 7,781,774 B2
(45) Date of Patent: Aug. 24, 2010

(54) THIN FILM TRANSISTOR ARRAY PANEL

(75) Inventors: Seung-Hwan Cho, Hwaseong-si (KR); Young-Min Kim, Yongin-si (KR); Keun-Kyu Song, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 275 days.

(21) Appl. No.: 11/559,162

(22) Filed: Nov. 13, 2006

(65) Prior Publication Data
US 2007/0284585 A1   Dec. 13, 2007

(30) Foreign Application Priority Data
Jun. 9, 2006   (KR) .................. 10-2006-0052008

(51) Int. Cl.
*H01L 29/04* (2006.01)
*H01L 31/036* (2006.01)
(52) U.S. Cl. .................. 257/72; 257/40; 257/51
(58) Field of Classification Search ......... 257/40, 257/51, 57, 66, 72
See application file for complete search history.

(56) References Cited

U.S. PATENT DOCUMENTS

| 7,274,039 | B2 * | 9/2007 | Park ............................ 257/72 |
| 7,342,247 | B2 * | 3/2008 | Lee et al. ..................... 257/40 |
| 7,567,309 | B2 * | 7/2009 | Denda et al. ................. 349/43 |
| 2007/0040171 | A1 * | 2/2007 | Kim et al. ..................... 257/57 |

FOREIGN PATENT DOCUMENTS

CN         1761067       4/2006

* cited by examiner

*Primary Examiner*—Phuc T Dang
(74) *Attorney, Agent, or Firm*—Cantor Colburn LLP

(57) ABSTRACT

A thin film transistor array panel and a method of manufacturing the same include: a substrate; a data line formed on the substrate; a gate line intersecting the data line and including a gate electrode; a source electrode connected to the data line; a drain electrode opposite the source electrode; an organic semiconductor partly in contact with the source electrode and the drain electrode; a gate insulating member positioned between the gate electrode and the organic semiconductor; and an insulating bank having an opening where the organic semiconductor and the gate insulating member are positioned and is formed in a cross shape in which a horizontal part and a vertical part intersect.

8 Claims, 18 Drawing Sheets

THIN FILM TRANSISTOR ARRAY PANEL

This application claims priority to Korean Patent Application No. 10-2006-0052008, filed on Jun. 9, 2006, and all the benefits accruing therefrom under 35 U.S.C. § 119, the contents of which in its entirety are herein incorporated by reference.

BACKGROUND OF THE INVENTION (a) Field of the Invention

The present invention relates to a thin film transistor array panel and a method of manufacturing the same.

(b) Description of the Related Art

In general, a flat panel display such as a liquid crystal display ("LCD"), an organic light emitting diode ("OLED") display, and an electrophoretic display includes a plurality of pairs of field generating electrodes and electro-optical active layers interposed therebetween. The LCD includes a liquid crystal layer as the electro-optical active layer, and the OLED display includes an organic light emitting layer as the electro-optical active layer.

One field generating electrode forming one pair of the field generating electrodes is generally connected to a switching element to receive an electrical signal, and an electro-optical active layer converts the electrical signal to an optical signal, thereby displaying an image.

In the flat panel display, a thin film transistor ("TFT"), which is a three terminal element, is used as the switching element, and a gate line that transfers a scanning signal for controlling the TFT and a data line that transfers a signal to be applied to a pixel electrode are provided in the flat panel display.

Research into organic thin film transistors ("OTFTs") including an organic semiconductor instead of an inorganic semiconductor, such as silicon (Si) among the TFTs, has been actively conducted.

Since the OTFT can be manufactured in a fiber or film form in view of characteristics of an organic material, it has been in the spotlight as a core element of a flexible display device.

Furthermore, because the OTFT can be manufactured with a solution process at a low temperature, the OTFT can be easily applied even to a large flat display being only limited by a deposition process thereof.

An inkjet printing method among the solution processes is a method of dropping an organic solution in a predetermined area defined by an insulating bank and which can easily form an organic thin film such as an organic semiconductor or an insulating film.

However, an organic thin film formed by the inkjet printing method has a non-uniform thickness. In particular, a part of the organic semiconductor which comes in close contact with the insulating bank is formed thick and a part of the organic semiconductor far apart from the insulating bank is formed thin, due to surface characteristics of an organic semiconductor and an insulating bank surrounding the semiconductor. In this case, a non-uniform thickness in a portion of the organic semiconductor in which a channel is formed may influence characteristics of the TFT.

Furthermore, the OTFT has a different structure and manufacturing method compared to existing TFTs. For example, as the number of masks required for manufacturing the OTFT increases, the cost of manufacturing the OTFT increases remarkably.

BRIEF SUMMARY OF THE INVENTION

The present invention has been made in an effort to provide a thin film transistor array panel and a method of manufacturing the same having advantages of maintaining characteristics of an OTFT and reducing the number of required masks.

An exemplary embodiment of the present invention provides a thin film transistor array panel including: a substrate; a data line formed on the substrate; a gate line intersecting the data line and including a gate electrode; a source electrode connected to the data line; a drain electrode opposite the source electrode; an organic semiconductor partly in contact with the source electrode and the drain electrode; a gate insulating member positioned between the gate electrode and the organic semiconductor; and an insulating bank having an opening where the organic semiconductor and the gate insulating member are positioned and formed in a cross shape in which a horizontal part and a vertical part of the cross shape intersect.

Each of the source electrode and the drain electrode may be formed along the vertical part.

The gate insulating member may be formed along the horizontal part and the vertical part, and the organic semiconductor may be formed along the vertical part.

The source electrode and the drain electrode may comprise indium tin oxide ("ITO") or indium zinc oxide ("IZO").

A thickness of the insulating bank may be larger than a sum of a thickness of the gate insulating member and a thickness of the organic semiconductor.

The organic semiconductor and the gate insulating member may include a soluble organic material.

Another exemplary embodiment of the present invention provides a method of manufacturing a thin film transistor array panel, the method including: forming a data line on a substrate; forming an interlayer insulating film on the data line; forming a gate line including a gate electrode on the interlayer insulating film; forming a organic film on the interlayer insulating film and the gate line; forming an opening which exposes the gate electrode by exposing and developing the organic film, the opening having a cross shape consisting of a horizontal part and a vertical part intersecting the horizontal part; forming a gate insulating member in the opening; forming a source electrode and a drain electrode on the organic film and the gate insulating member; and forming an organic semiconductor on the source electrode and the drain electrode which are positioned in the opening.

The forming of the gate insulating member and the forming of the organic semiconductor may be performed by an inkjet printing method.

The forming of the gate insulating member may include dropping a gate insulating solution along the horizontal part, and dropping a gate insulating solution along the vertical part.

The forming of the organic semiconductor may be done by dropping an organic semiconductor solution along the vertical part.

The source electrode and the drain electrode may be formed along the vertical part.

The method may further include treating the organic film surface after the forming of the opening.

The treating of the organic film surface may be done by performing hydrophobic processing of the organic film surface.

The hydrophobic processing may be done by processing the organic film surface with fluorine by supplying a fluorine-containing gas to the organic film.

At least one of the forming of the gate insulating member and the forming of the organic semiconductor may include a gate insulating solution or an organic semiconductor solution, respectively, in only the opening processed by the fluorine processing.

BRIEF DESCRIPTION OF THE DRAWINGS

The present invention will become more apparent by further describing exemplary embodiments thereof with reference to the accompanying drawings, in which.

DETAILED DESCRIPTION OF THE INVENTION

Figure 1:
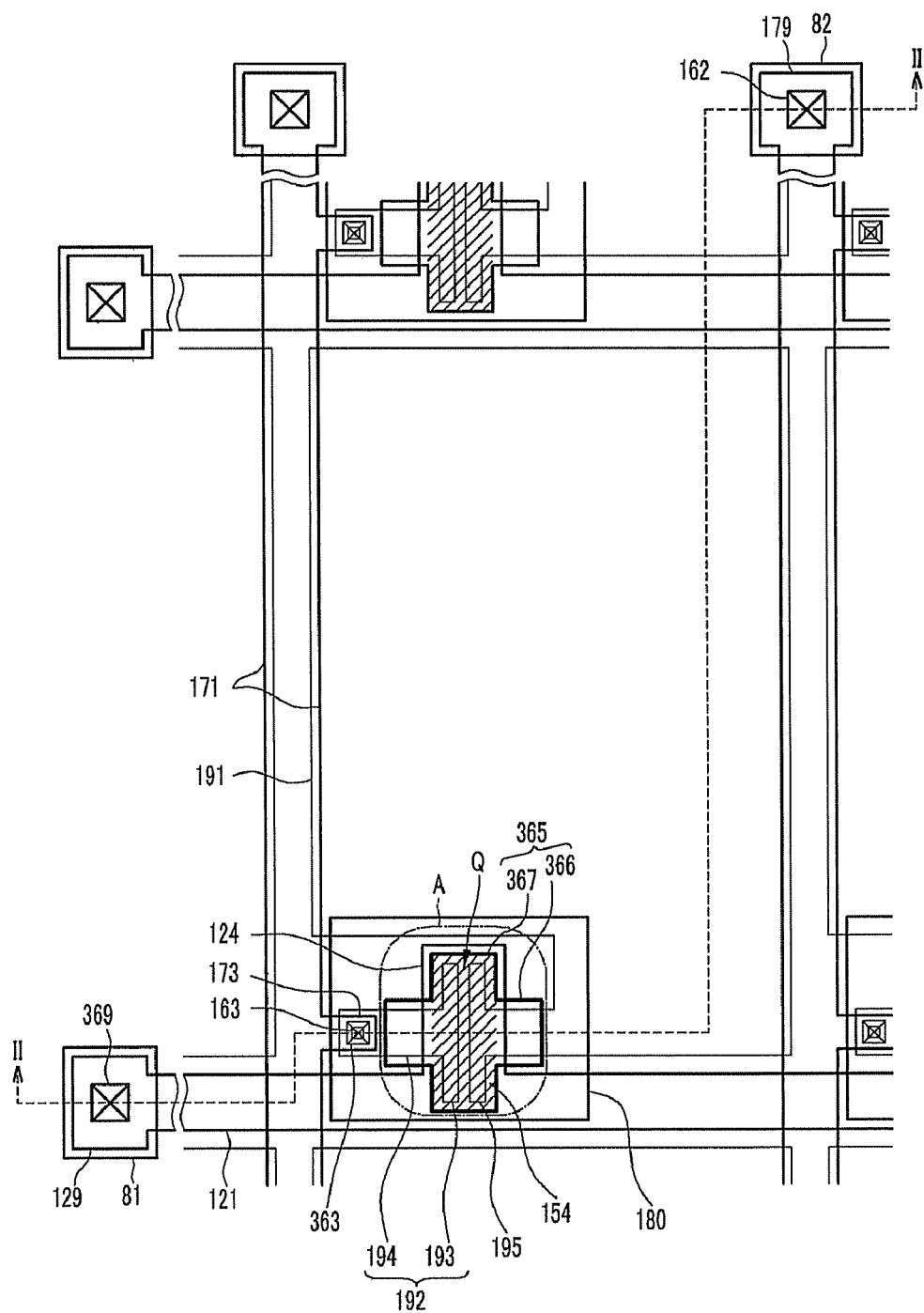
FIG. 1 is a plan view layout of a thin film transistor array panel according to an exemplary embodiment of the present invention.

The present invention will be described more fully hereinafter with reference to the accompanying drawings, in which exemplary embodiments of the present invention are shown. This invention may, however, be embodied in many different forms and should not be construed as limited to the exemplary embodiments set forth herein.

In the drawings, the thickness of layers, films, panels, regions, etc., are exaggerated for clarity. Like reference numerals designate like elements throughout the specification. When it is said that any part, such as a layer, film, area, or plate is positioned on another part, it means the part is directly on the other part or above the other part with at least one intermediate part. In contrast, when an element is referred to as being "directly on" another element, there are no intervening elements present. As used herein, the term "and/or" includes any and all combinations of one or more of the associated listed items.

It will be understood that, although the terms first, second, third, etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present invention.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising" or "includes" and/or "including" when used in this specification specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention. As used herein, the term "and/or" includes any and all combinations of one or more of the associated listed items.

Now, a thin film transistor array panel according to an exemplary embodiment of the present invention will be described in more detail with reference to FIGS. 1 and 2.

FIG. 1 is a plan view layout of a thin film transistor array panel according to an exemplary embodiment of the present invention. FIG. 2 is a cross-sectional view of the thin film transistor array panel taken along line II-II of FIG. 1.

A plurality of data lines 171 are formed on an insulating substrate 110 which is made of transparent glass, silicone, plastic, or other suitable material.

The data lines 171 transfer data signals and generally extend in a vertical direction, as illustrated in FIG. 1. Each data line 171 includes a plurality of projections 173 projecting to the side, and a wide end portion 179 for connecting to other layers or an external driving circuit (not shown). A data driving circuit (not shown) for generating a data signal may be mounted on a flexible printed circuit film (not shown) attached on the substrate 110, directly mounted on the substrate 110, or integrated with the substrate 110. When the data driving circuit is integrated with the substrate 110, the data line 171 is extended to directly connect thereto.

The data lines 171 may be made of a low resistance conductor consisting of aluminum containing metals such as aluminum (Al) or an aluminum alloy, silver containing metals such as silver (Ag) or a silver alloy, gold containing metals such as gold (Ag) or a gold alloy, copper containing metals such as copper (Cu) or a copper alloy, molybdenum containing metals such as molybdenum (Mo) or a molybdenum alloy, chrome (Cr), thallium (Ta) and titanium (Ti). However, the data lines 171 may have a multiple film structure including two conductive films (not shown) having different physical properties.

The sides of the data line 171 are inclined relative to the surface of the substrate 110, and the inclination angles are desirably about 30° to about 80°.

An interlayer insulating film 160 is formed on the data line 171. The interlayer insulating film 160 may be made of a non-organic insulator, such as silicon nitride ("SiNx") or silicon oxide ("SiO$_2$"), and a thickness thereof may be about 2000 Å to about 5000 Å. The interlayer insulating film 160 has a plurality of contact holes 163 and 162 for exposing each of a projection 173 and an end portion 179, respectively, of the data line 171.

A plurality of gate lines 121 are formed on the interlayer insulating film 160. The gate lines 121 transfer gate signals and generally extend in a horizontal direction to intersect the data lines 171, as illustrated in FIG. 1. Each gate line 121 includes a plurality of gate electrodes 124 projecting to the upper side and a wide end portion 129 for connecting to other layers or an external driving circuit (not shown). A gate driving circuit (not shown) for generating a gate signal may be mounted on a flexible printed circuit film (not shown) that is attached on the substrate 110, directly mounted on the substrate 110, or integrated with the substrate 110. When the gate driving circuit is integrated with the substrate 110, the gate line 121 extends to directly connect to the gate driving circuit.

The gate line 121 may be made of a conductive material that is selected from the same conductive materials for the data line 171. The sides of the data line 171 are inclined relative to the surface of the substrate 110, and the inclination angles are desirable about 30° to about 80°.

An insulating bank 361 is formed on the entire surface of the substrate including the gate line 121 and the interlayer insulating film 160. The insulating bank 361 may be made of a photosensitive organic material which can perform a solution process, and a thickness thereof may be about 5000 Å to about 4 μm.

The insulating bank 361 has a plurality of openings 365 and a plurality of contact holes 363 and 369. Each opening 365 has a cross shape in which a horizontal part 366 is formed along a horizontal direction and a vertical part 367 is formed along a vertical direction, as illustrated in FIG. 1, intersecting and exposing the gate electrode 124.

A gate insulating member 140 is formed in the opening 365. The gate insulating member 140 fills the entire opening 365 formed in a cross shape. The gate insulating member 140 is made of an organic material or an inorganic material having a relative high dielectric constant. The organic material includes, for example, a soluble polymer such as polyimide, polyvinyl alcohol, polyfluorane, or parylene. The inorganic material includes, for example, silicon oxide whose surface is processed with octadecyl trichloro silane ("OTS").

The contact holes 363 and 369 expose the projection 173 of the data line 171 and the end portion 129 of the gate line 121, respectively.

A plurality of connection electrodes 192, a plurality of pixel electrodes 191, and a plurality of contact assistants 81 and 82 are formed on the insulating bank 361 and the gate insulating member 140.

The connection electrode 192 may have an island shape. The connection electrode 192 includes a connection part 194 formed in a part of the horizontal part 366 of the opening 365 and is connected to the data line 171 through the contact holes 163 and 363 and a portion (hereinafter, referred to as a 'source electrode') 193 formed along the vertical part 367 of the opening 365.

The pixel electrode 191 includes a part (hereinafter, referred to as a 'drain electrode') 195 formed along the vertical part 367 of the opening 365 and is opposite to the source electrode 193 about the gate electrode 124.

The pixel electrode 191 which receives a data voltage from a TFT and a common electrode (not shown) of another array panel (not shown) which receives a common voltage generate an electrical field, thereby determining a direction of liquid crystal molecules of a liquid crystal layer (not shown) between two electrodes. As the pixel electrode 191 and the common electrode constitute a capacitor (hereinafter, referred to as a "liquid crystal capacitor"), the pixel electrode 191 and the common electrode maintain an applied voltage even after the TFT is turned off.

As the pixel electrode 191 may overlap the gate line 121 and/or the data line 171, an aperture ratio can be increased.

Contact assistants 81 and 82 are connected to the end portion 129 of the gate line 121 and the end portion 179 of the data line 171 through the contact holes 369 and 162, respectively. The contact assistants 81 and 82 compensate adhesion between the end portion 129 of the gate line 121 and the end portion 179 of the data line 171 and an external apparatus (not shown) and protect them.

The source electrode 193, the pixel electrode 191, and the contact assistants 81 and 82 are made of a transparent conductive material such as indium zinc oxide ("IZO") or indium tin oxide ("ITO"), and a thickness thereof may be about 300 Å to about 2000 Å.

A plurality of organic semiconductors 154 are formed in the opening 365 of the insulating bank 361. The organic semiconductor 154 is formed along the vertical part 367 of the opening 365, and is indicated with hatched lines in FIG. 1.

The organic semiconductor 154 is in contact with the source electrode 193 and the drain electrode 195, and because a height of the organic semiconductor 154 is lower than that of the insulating bank 361, the organic semiconductor 154 is completely surrounded by the insulating bank 361. Because a side surface of the organic semiconductor 154 is not exposed as the organic semiconductor 154 is completely surrounded by the insulating bank 361, a chemical solution can be prevented from penetrating the side surface of the organic semiconductor 154 in a subsequent process.

The organic semiconductor 154 may include a high molecular weight compound or a low molecular weight compound that is soluble in an aqueous solution or an organic solvent.

The organic semiconductor 154 may include a derivative including a substituent such as tetracene or pentacene. The organic semiconductor 154 may also include oligothiophene including 4 to 8 thiophenes connected to a position 2 and 5 of a thiophene ring.

The organic semiconductor 154 may include polythienylenevinylene, poly 3-hexylthiophene, polythiophene, phthalocyanine, metallized phthalocyanine, or a halogen derivative thereof. The organic semiconductor 154 may also include perylenetetracarboxylic dianhydride ("PTCDA"), naphthalenetetracarboxylic dianhydride ("NTCDA"), or their imide derivatives. The organic semiconductor 154 may also include a derivative including perylene or coronene and their substituents.

A thickness of the organic semiconductor 154 may be about 300 Å to about 3000 Å.

As a thickness of the insulating bank 361 is larger than the sum of a thickness of the gate insulating member 140 and a thickness of the organic semiconductor 154, side surfaces of the gate insulating member 140 and the organic semiconductor 154 are completely surrounded by the insulating bank 361.

One gate electrode 124, one source electrode 193, one drain electrode 195 and an organic semiconductor 154 constitute one TFT. A channel Q (FIG. 1) of the TFT is formed in the organic semiconductor 154 between the source electrode 193 and the drain electrode 195.

A protection member 180 is formed on the organic semiconductor 154. The protection member 180 for protecting an OTFT can be formed on a partial surface or the entire surface of the substrate, and alternatively, may be omitted.

Now, a method of manufacturing an organic thin film transistor array panel shown in FIGS. 1 and 2 will be described in more detail with reference to FIGS. 3 to 18.

Figure 2:
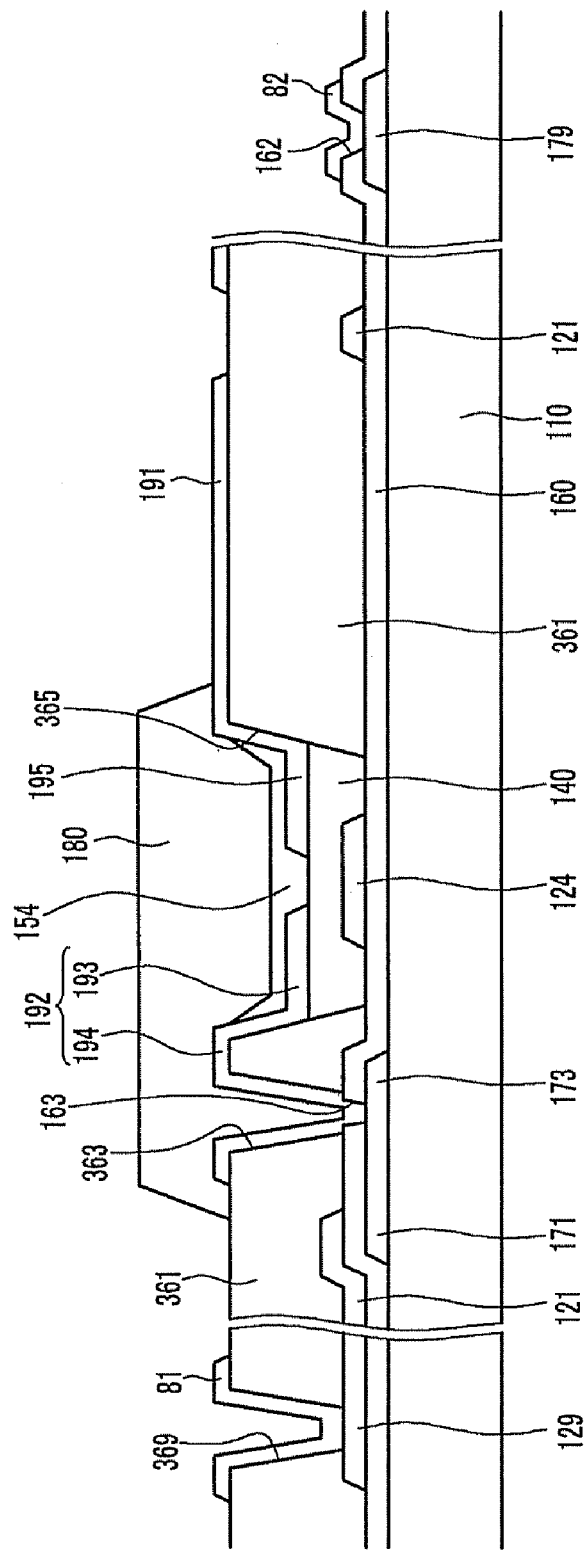
FIG. 2 is a cross-sectional view of the thin film transistor array panel taken along line II-II of FIG. 1.
Figure 11A:
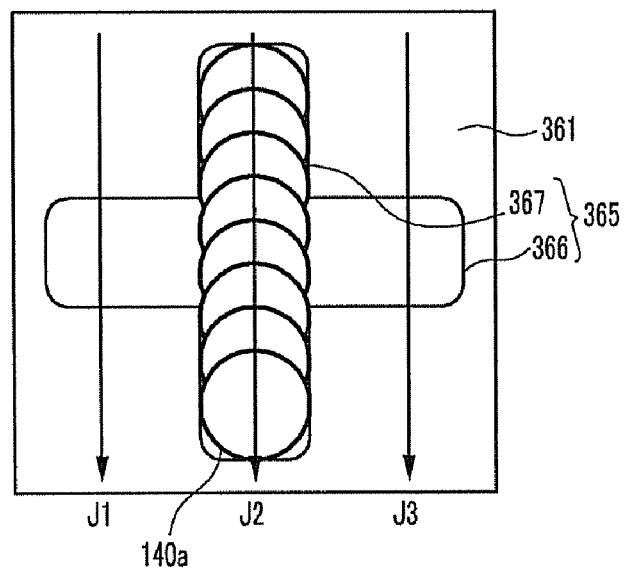
FIGS. 11A and 11B are schematic plan views schematically illustrating a state of dropping a gate insulating solution into an opening, which is an enlarged portion 'A' of FIG. 1.
Figure 11B:
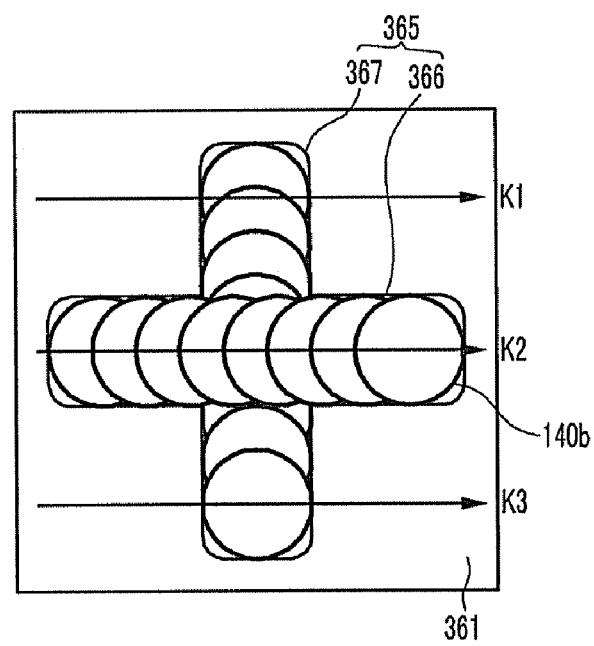
Figure 12:
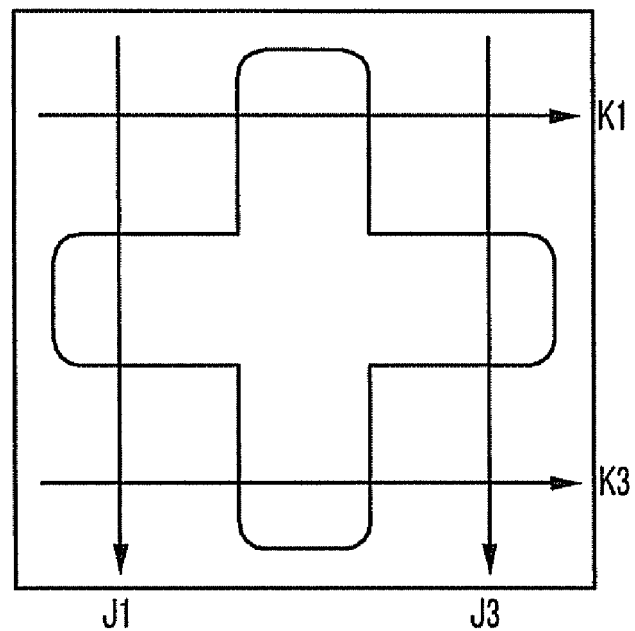
FIG. 12 is a schematic plan view illustrating a process margin range of an opening where a gate insulating solution can be dropped.
Figure 13:
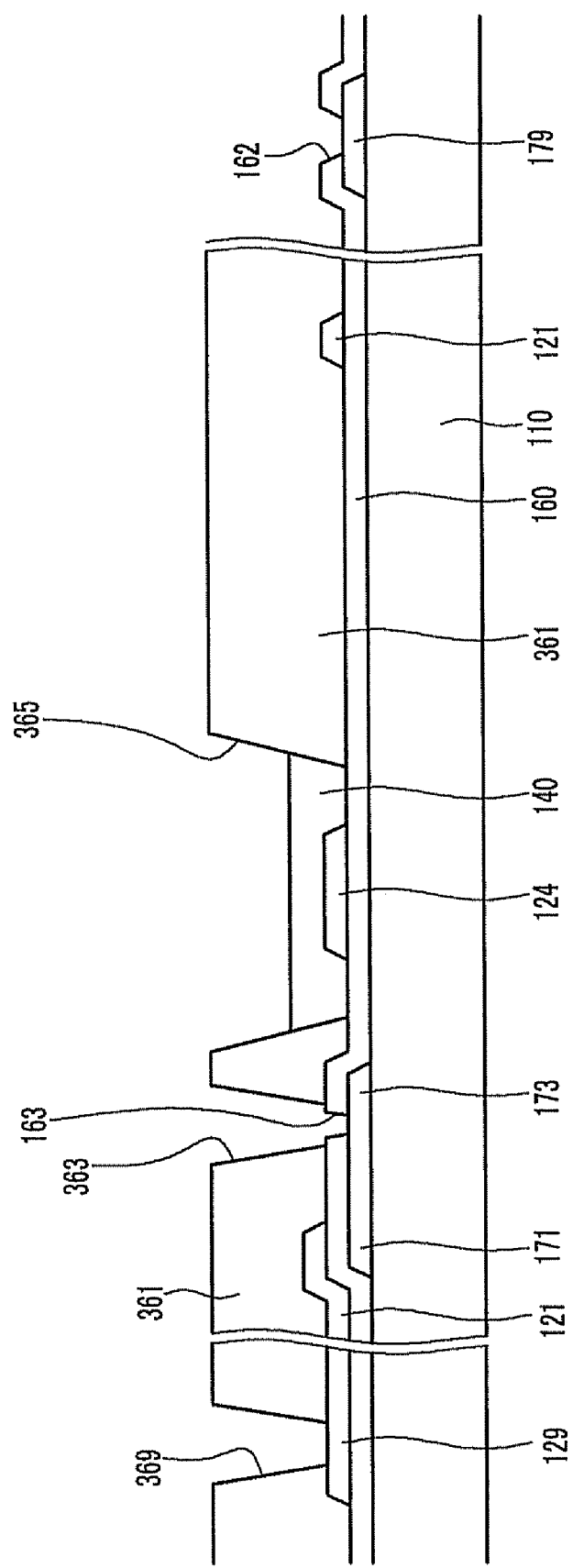
FIG. 13 is a cross-sectional view of the thin film transistor array panel formed according to FIGS. 11A to 12.

FIGS. 3, 5, 7, 9, 14, and 17 are plan view layouts sequentially illustrating a method of manufacturing the thin film transistor array panel of FIGS. 1 and 2 according to an exemplary embodiment of the present invention. FIG. 4 is a cross-sectional view of the thin film transistor array panel taken along line IV-IV of FIG. 3. FIG. 6 is a cross-sectional view of the thin film transistor array panel taken along line VI-VI of FIG. 5. FIG. 8 is a cross-sectional view of the thin film transistor array panel taken along line VIII-VIII of FIG. 7. FIG. 10 is a cross-sectional view of the thin film transistor array panel taken along line X-X of FIG. 9. FIGS. 11A and 11B are schematic plan views sequentially illustrating a state of dropping a gate insulating solution into an opening, which is an enlarged portion 'A' of FIG. 1. FIG. 12 is a schematic plan view illustrating a process margin range of an opening where a gate insulating solution can be. FIG. 13 is a cross-sectional view of the thin film transistor array panel formed according to FIGS. 11A to 12. FIG. 15 is a cross-sectional view of the thin film transistor array panel taken along line XV-XV of FIG. 14. FIG. 16 is a schematic plan view illustrating a process margin area where a gate insulating solution can be dropped. FIG. 18 is a cross-sectional view of the thin film transistor array panel taken along line XVIII-XVIII of FIG. 17.

Figure 3:
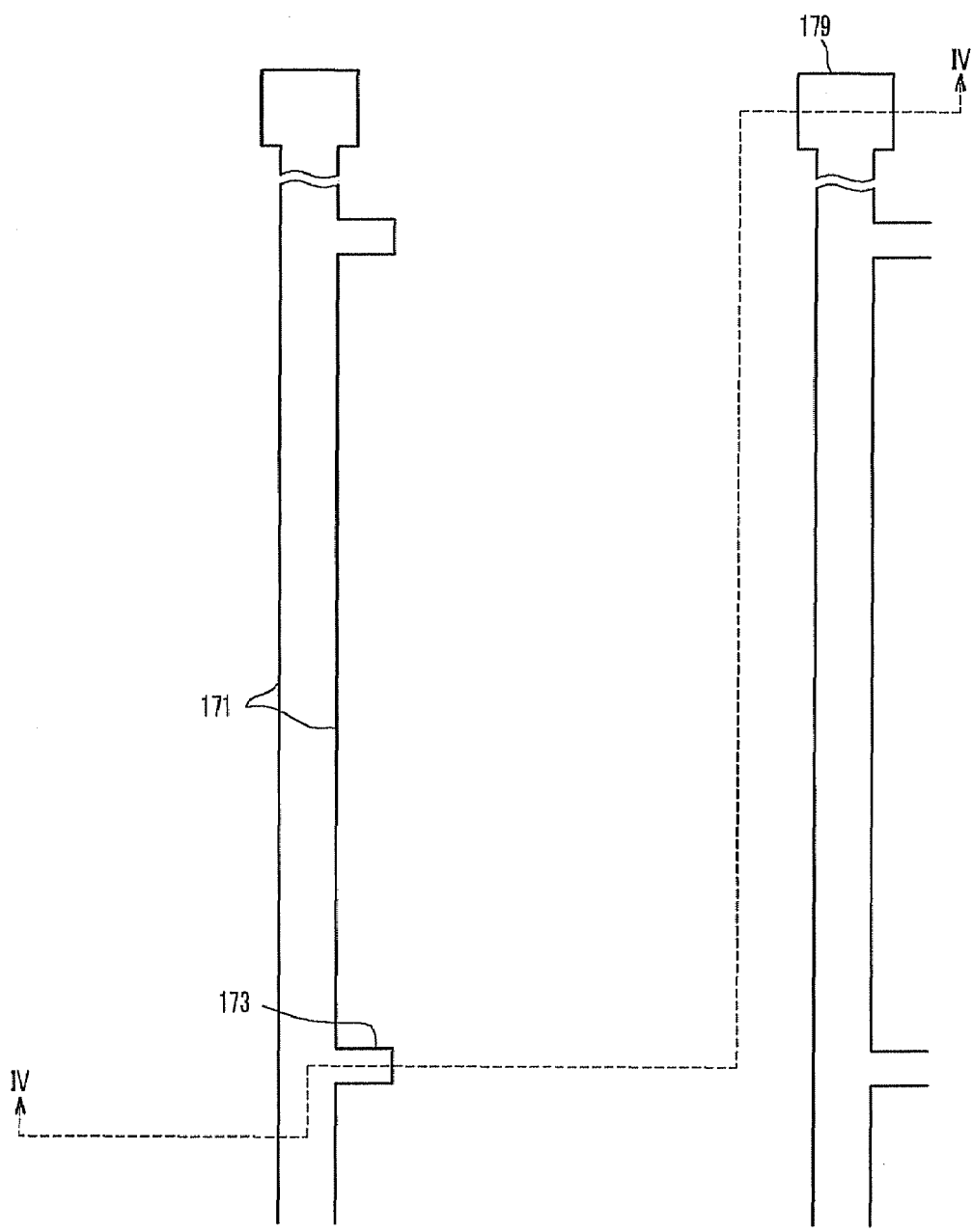
FIGS. 3, 5, 7, 9, 14, and 17 are plan view layouts sequentially illustrating a method of manufacturing the thin film transistor array panel of FIGS. 1 and 2 according to an exemplary embodiment of the present invention.
Figure 4:
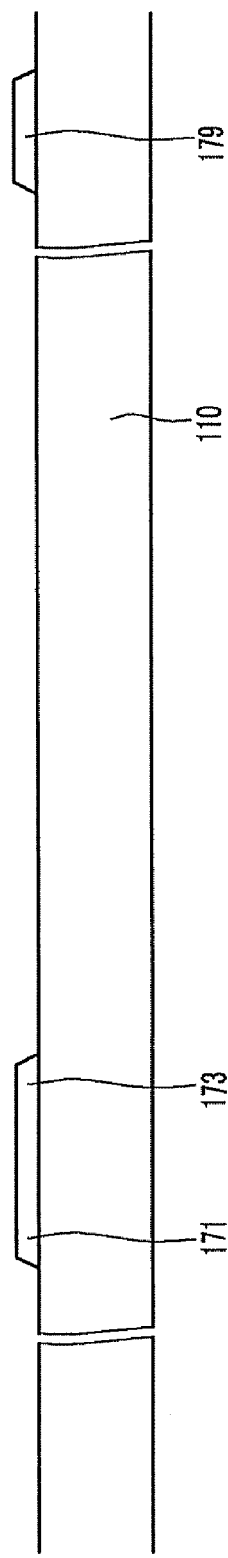
FIG. 4 is a cross-sectional view of the thin film transistor array panel taken along line IV-IV of FIG. 3.

First, as shown in FIGS. 3 and 4, conductive layers are formed on the substrate 110 using a method such as sputtering, for example, and the data line 171 including the projection 173 and the end portion 179 are formed by performing a photolithography and etching process on the conductive layer.

Figure 5:
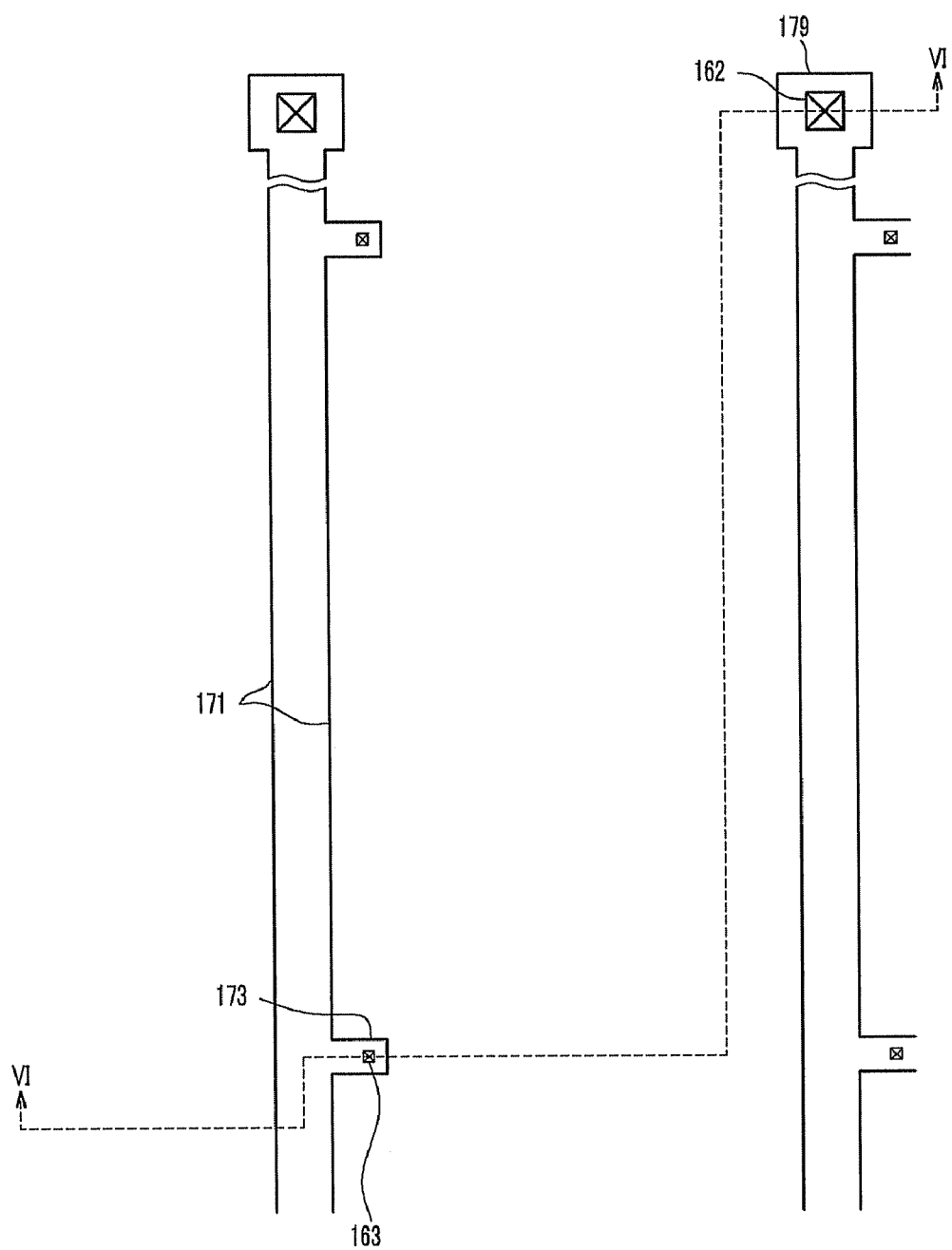
Figure 6:
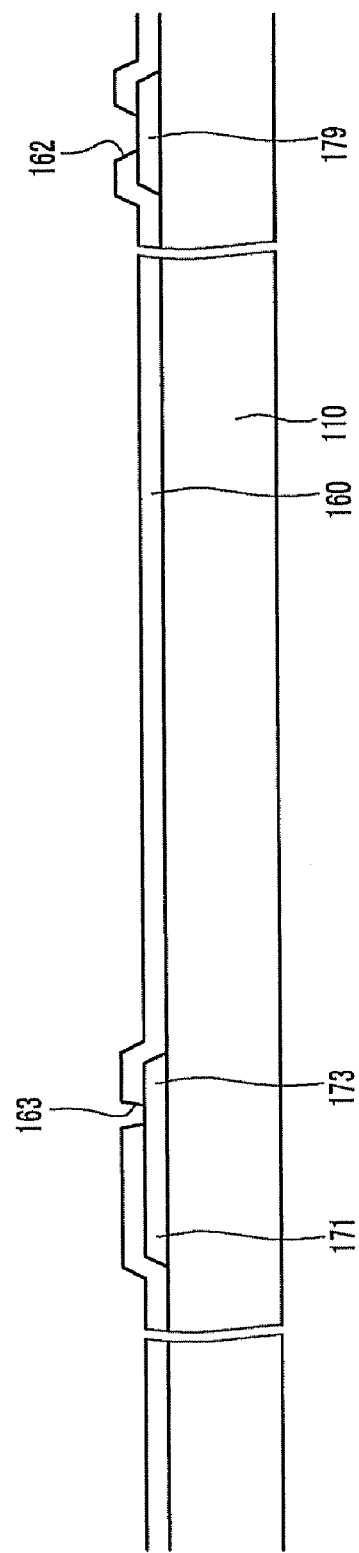
FIG. 6 is a cross-sectional view of the thin film transistor array panel taken along line VI-VI of FIG. 5.

Next, as shown in FIGS. 5 and 6, an interlayer insulating film 160 is formed by processing SiNx with a chemical vapor deposition ("CVD") method, and contact holes 162 and 163 are formed by coating a photosensitive film on the interlayer insulating film 160 and performing a photolithography and etching process on the photosensitive film.

Figure 7:
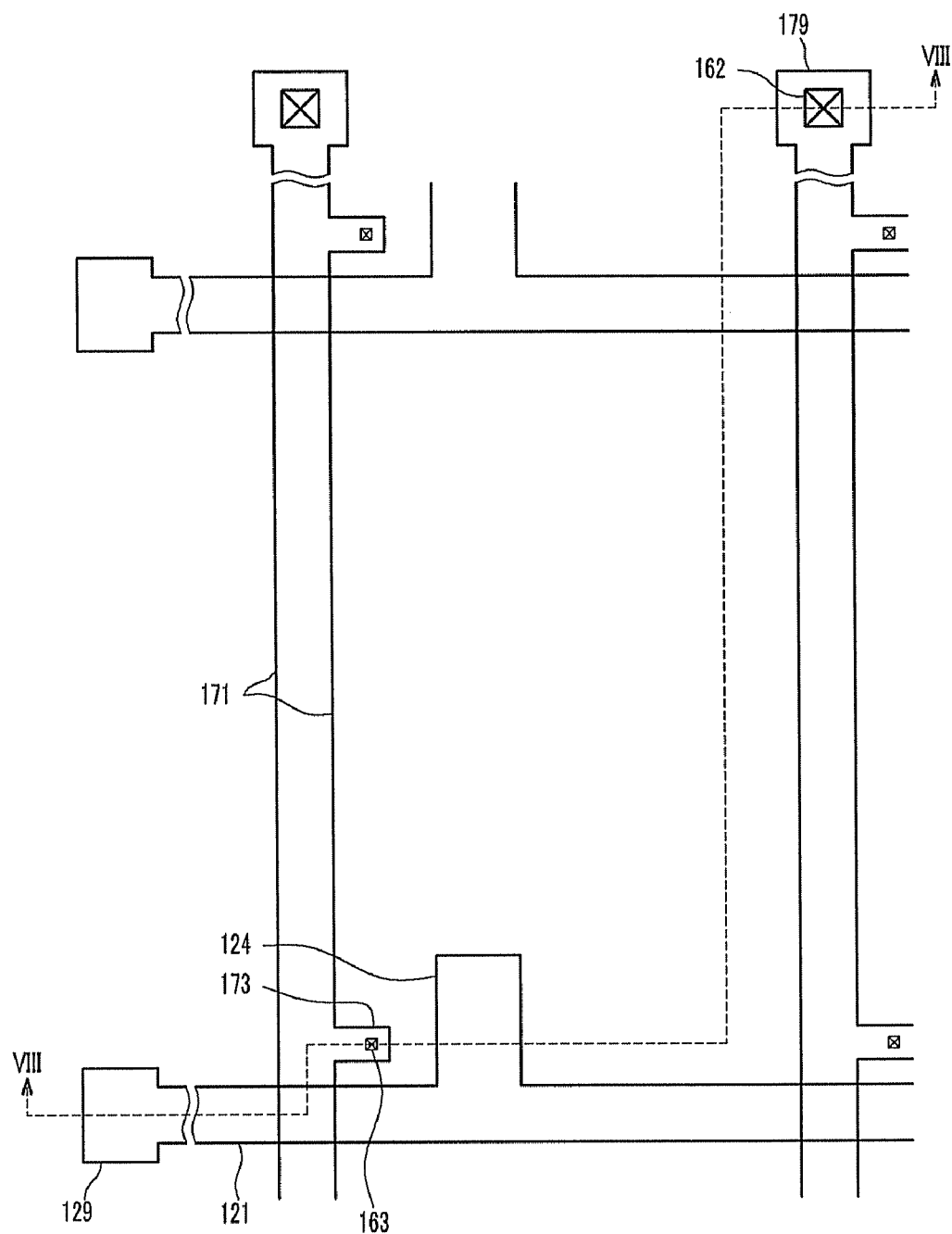
Figure 8:
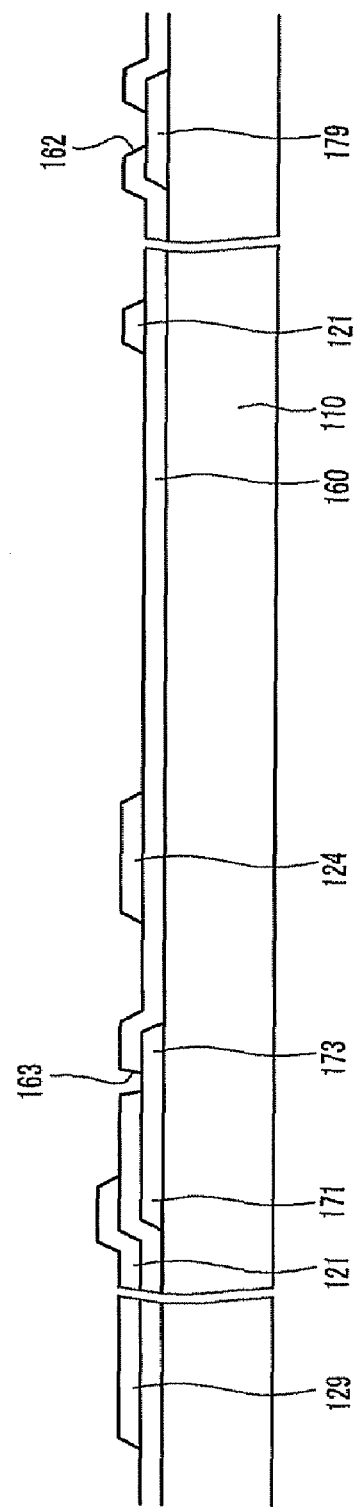
FIG. 8 is a cross-sectional view of the thin film transistor array panel taken along line VIII-VIII of FIG. 7.

Next, as shown in FIGS. 7 and 8, by forming conductive layers with a method such as sputtering and performing a photolithography and etching process of the conductive layers, the gate line 121 including the gate electrode 124 and the end portion 129 are formed.

Figure 9:
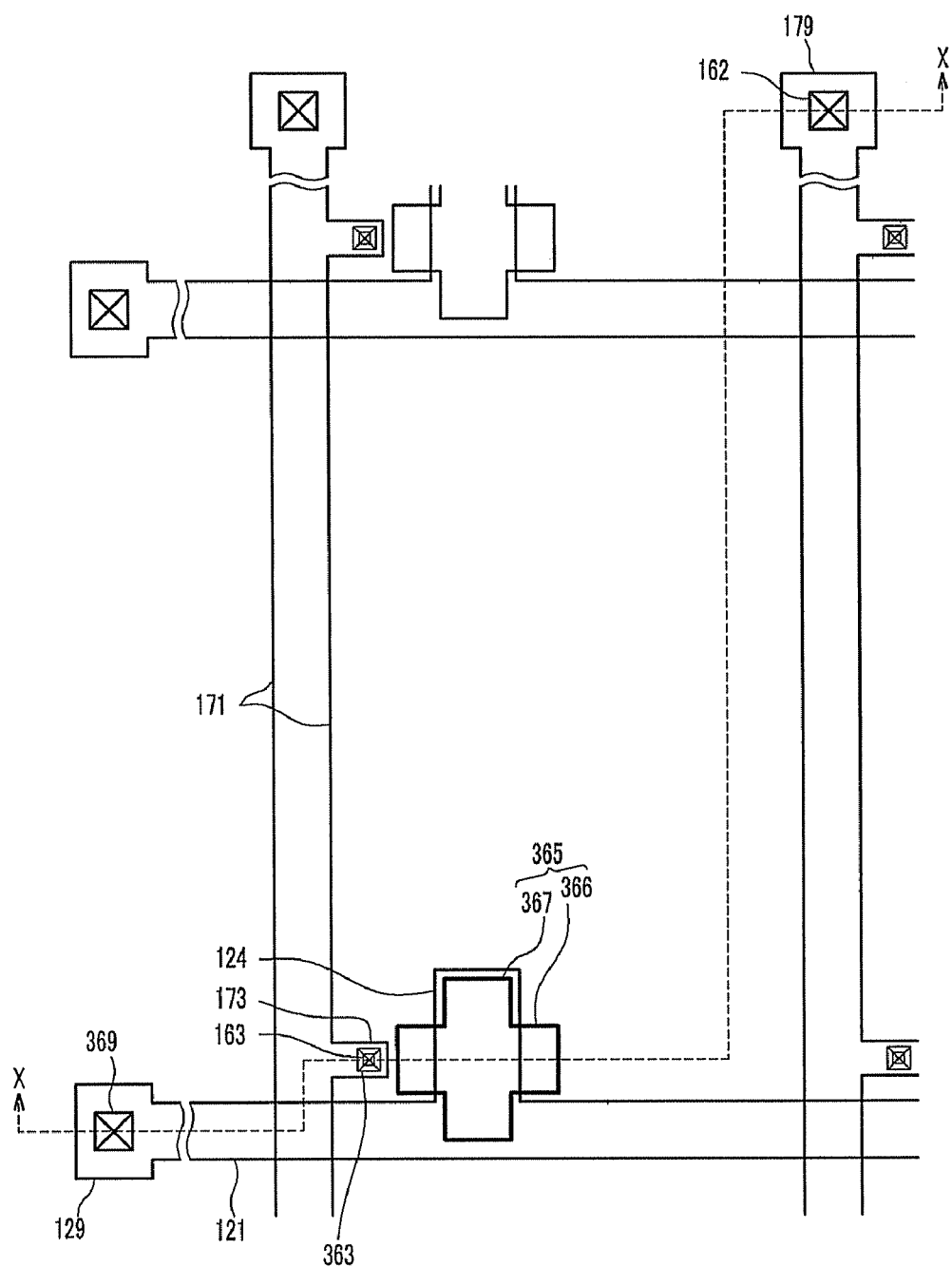
Figure 10:
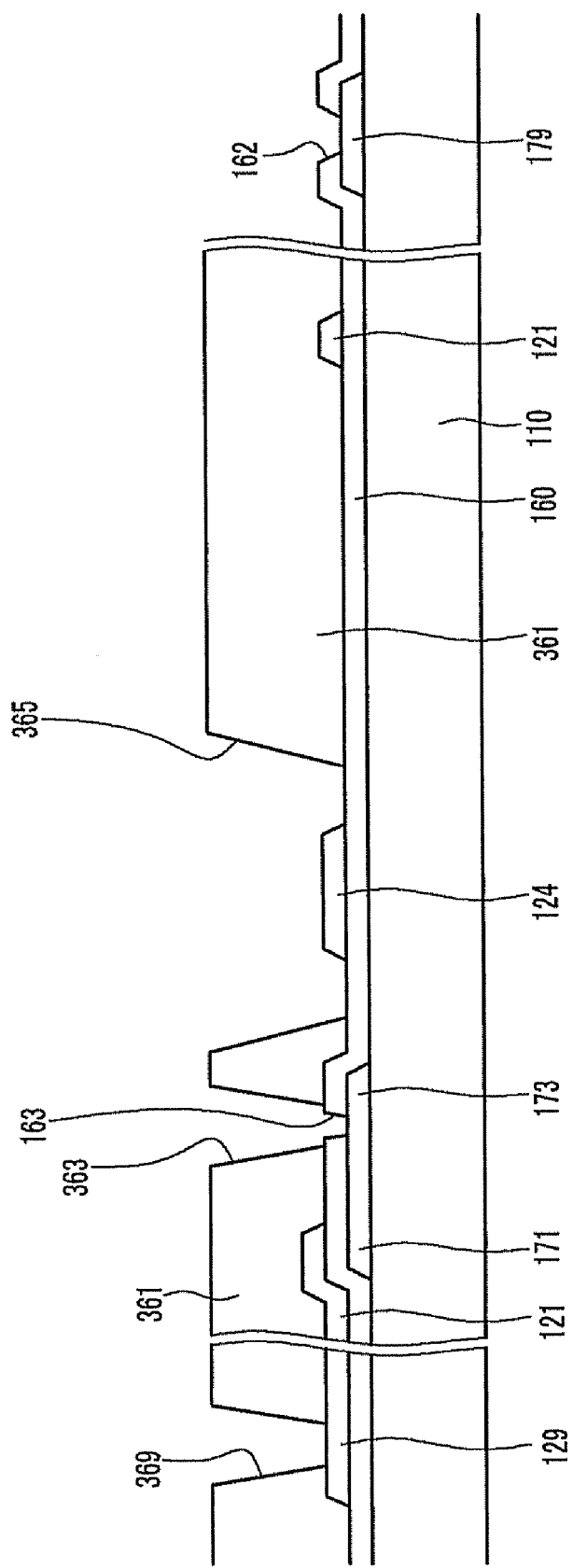
FIG. 10 is a cross-sectional view of the thin film transistor array panel taken along line X-X of FIG. 9.

Next, as shown in FIGS. 9 and 10, by applying a photosensitive film on an entire surface of the substrate 110 and exposing and developing the photosensitive film, the insulating bank 361 having a plurality of openings 365 and a plurality of contact holes 363 and 369 is formed. The opening 365 is formed in a cross shape consisting of the horizontal part 366 that is formed long in a horizontal direction and the vertical part 367 that is formed long in a vertical direction, as illustrated in FIG. 9. The insulating bank 361 is formed having a thickness larger than a desired thickness, for example, having a thickness of about 20,000 Å to about 30,000 Å.

Next, a surface of the insulating bank 361 is treated. Surface treatment is a technique of changing a surface of a material to have a hydrophilic property or a hydrophobic property using plasma.

In the present exemplary embodiment, the insulating bank 361 is processed with a fluorine-containing gas in a plasma atmosphere. For example, in a dry etching chamber, the fluorine-containing gas such as $CF_4$, $C_2F_6$, or $SF_6$ is supplied along with oxygen gas ($O_2$) and/or an inert gas. In this case, as a bonding between carbon (C) in the surface of the insulating bank 361 which is made of an organic material and fluorine (F) in the fluorine-containing gas occurs in a surface of the insulating bank 361, the surface of the insulating bank 361 is processed with fluorine, and as the gate electrode 124 and the interlayer insulating film 160 which are exposed through the opening 365 are made of an inorganic material, the gate electrode 124 and the interlayer insulating film 160 are not processed with fluorine. As the surface of the insulating bank 361 is processed with fluorine, the surface of the insulating bank 361 is treated to have a hydrophobic property, and a portion exposed through the opening 365 has a relatively hydrophilic property.

Next, the gate insulating member 140 is formed in the opening 365.

The gate insulating member 140 can be formed with an inkjet printing method, and this will be described with reference to FIGS. 11A to 13.

FIGS. 11A and 11B are schematic plan views sequentially illustrating a state of dropping depositing a gate insulating solution in the opening 365, which is an enlarged portion 'A' of FIG. 1.

As shown in FIG. 11A, several droplets of a gate insulating solution 140a are dropped along the vertical part 367 of the opening 365. In the drawings, the gate insulating solution 140a is dropped along a direction J2. However, as described above, because hydrophobic processing is performed on a surface of the insulating bank 361, a hydrophilic gate insulating solution 140a gathers within the opening 365 having a relatively hydrophilic property when droplets of the gate insulating solution 140a are dropped along a direction of the vertical part 367 as in a direction indicated by J1 or J3.

Next, as shown in FIG. 11B, several droplets of a gate insulating solution 140b are dropped along the horizontal part 366 of the opening 365. Similarly, in the drawings, the gate insulating solution 140b is dropped along a direction K2.

However, when droplets are dropped along a direction of the horizontal part 366, as in a direction indicated by K1 or K3, the hydrophilic gate insulating solution 140b gathers within the opening 365.

FIG. 12 is a schematic plan view illustrating a process margin range of an opening where a gate insulating solution can be dropped. Even if a gate insulating solution is not accurately sprayed within the opening 365, the solution can be gathered into the opening 365 depending on surface treatment of the insulating bank 361 when the solution is sprayed to only J1-J3 or K1-K3 area. Accordingly, as an area where the gate insulating solution can be dropped is widened, a process margin can be increased.

Next, if a solvent is removed through a drying process, for example, the gate insulating member 140 is formed in the opening 365 as shown in FIG. 13.

Figure 14:
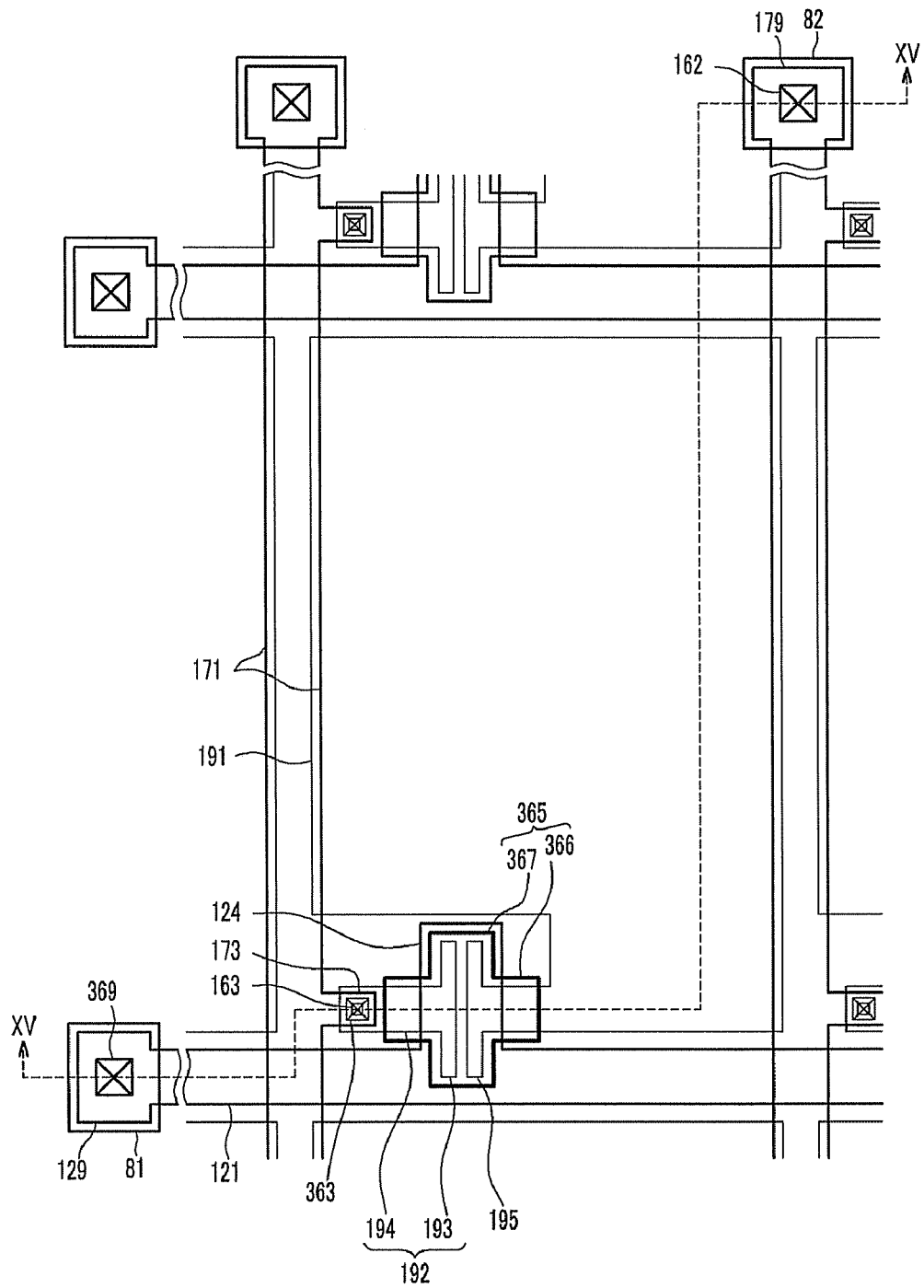
Figure 15:
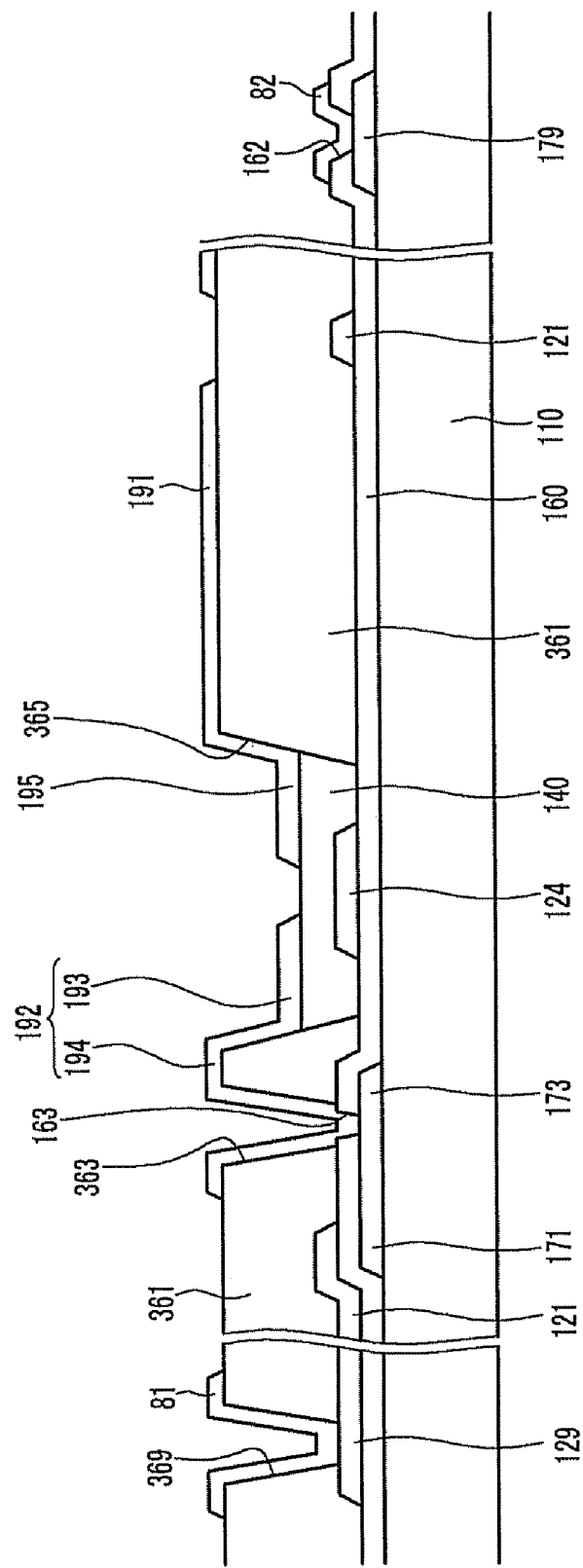
FIG. 15 is a cross-sectional view of the thin film transistor array panel taken along line XV-XV of FIG. 14.
Figure 16:
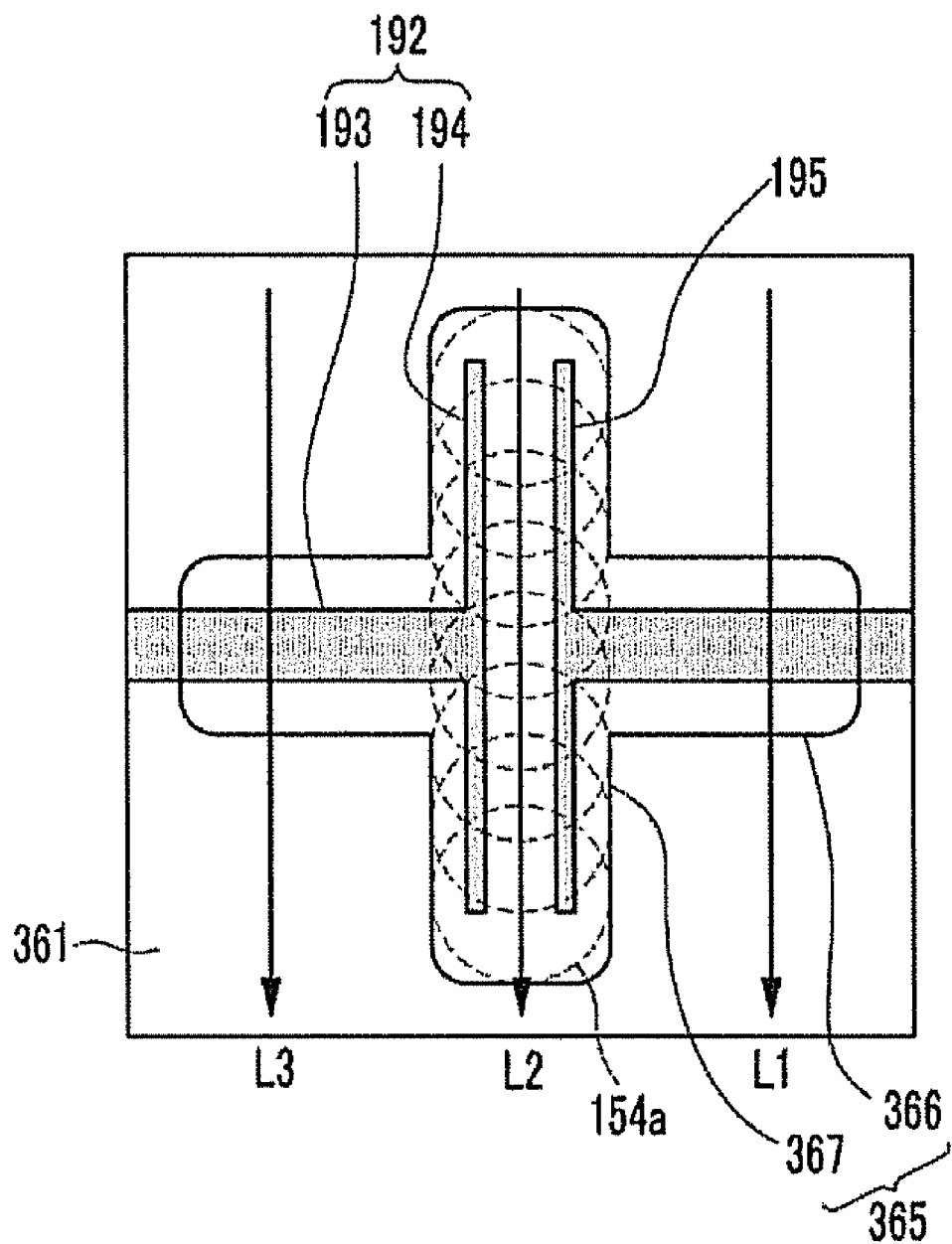
FIG. 16 is a schematic plan view illustrating a process margin area where a gate insulating solution can be deposited.

Next, as shown in FIGS. 14 and 15, by performing a photolithography and etching process on the insulating bank 361 and the opening 365 after ITO or IZO is sputtered in the insulating bank 361 and the opening 365, a connection electrode 192 including the source electrode 193 and the connection part 194, contact assistants 81 and 82, and the pixel electrode 191 including a drain electrode 195 are formed.

Next, as shown in FIG. 16, several droplets of the organic semiconductor solution 154a are dropped along the vertical part 367 of the opening 365.

In the drawing, the organic semiconductor solution 154a is dropped along a direction L2. However, as described above, because a surface of the insulating bank 361 is processed with a hydrophobic property, the hydrophilic organic semiconductor solution 140a gathers within the opening 365 having a relatively hydrophilic property when the solution is dropped in the same direction as the vertical part 367, as in a direction L1 or L3. Accordingly, as an area where the organic semiconductor solution 154a can be dropped is widened, a process margin can be increased.

The organic semiconductor solution 154a is not dropped along the horizontal part 366 of the opening 365.

As described above, according to an exemplary embodiment of the present invention, the gate insulating member 140 and the organic semiconductor 154 are formed in one opening 365. Therefore, when both the gate insulating member 140 and the organic semiconductor 154 are formed by an inkjet printing method, the number of masks required for forming a separate insulating bank to surround each of them can be reduced by one.

When the gate insulating member 140 and the organic semiconductor 154 are formed to be surrounded by a same insulating bank 361, the organic semiconductor solution having a hydrophilic property can be overflowed along the connection electrode 192 and the pixel electrode 191 which are positioned in the lower part of the opening.

In an exemplary embodiment of the present invention, the opening 365 is formed in a cross shape consisting of the horizontal part 366 and the vertical part 367, and the organic semiconductor solution 154a is dropped into only the vertical part 367 formed along a portion in which a channel (Q) of the TFT is formed, whereby the organic semiconductor solution 154a can be prevented from overflowing to the connection part 194 and/or the pixel electrode 191 side regardless of the channel (Q).

In this case, because an area in which the organic semiconductor solution 154a comes in contact with the insulating bank 361 also decreases, occurrence of non-uniformity in a thickness in which a part coming in close contact with the insulating bank among the organic semiconductor is formed to be thick and a central part in which the channel is formed is formed to be thin can be reduced, and the thickness of a portion in which a channel of the TFT is formed can be uniform. Accordingly, prevention of poor characteristics of the OTFT can be prevented.

Figure 17:
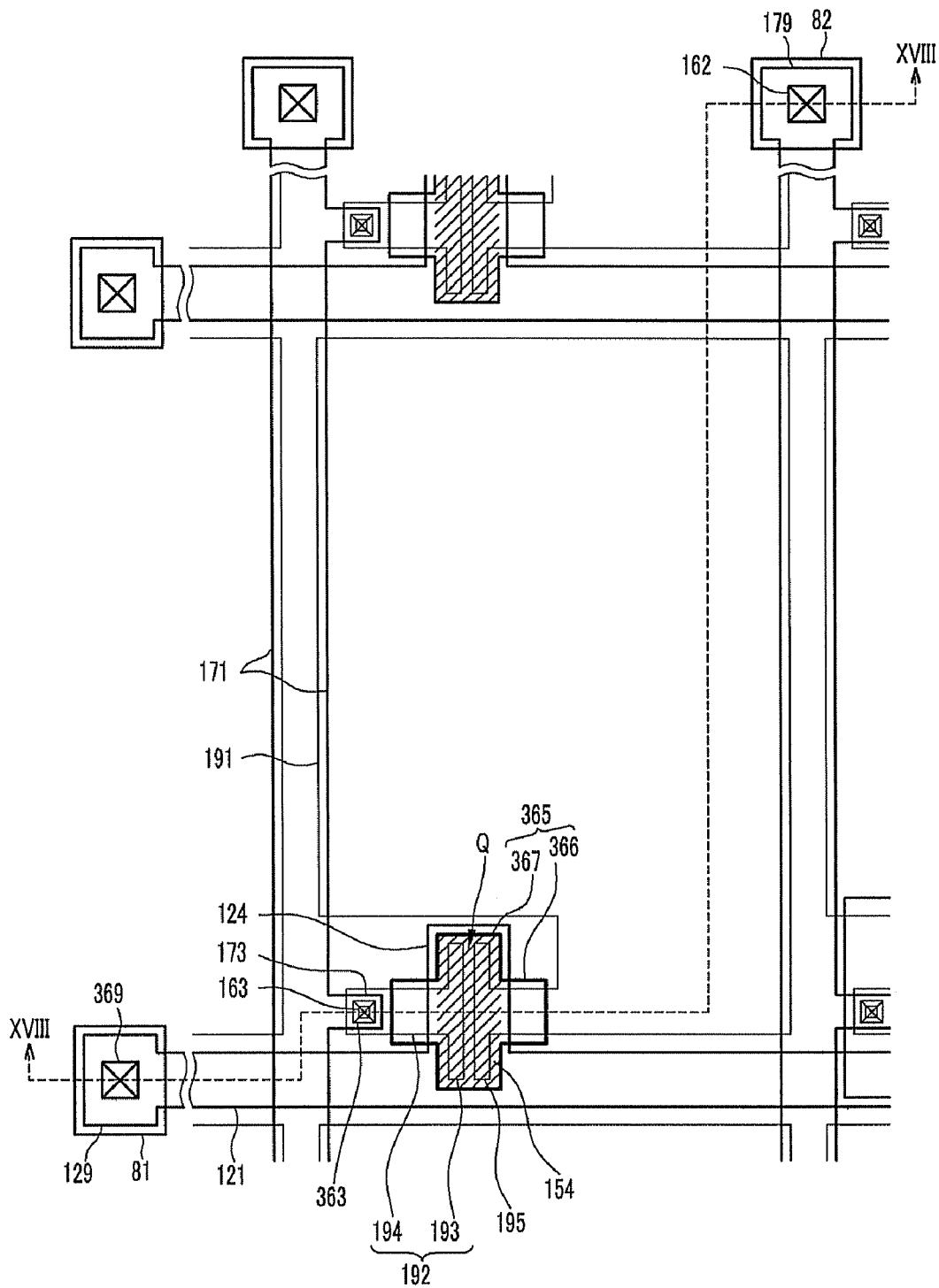
Figure 18:
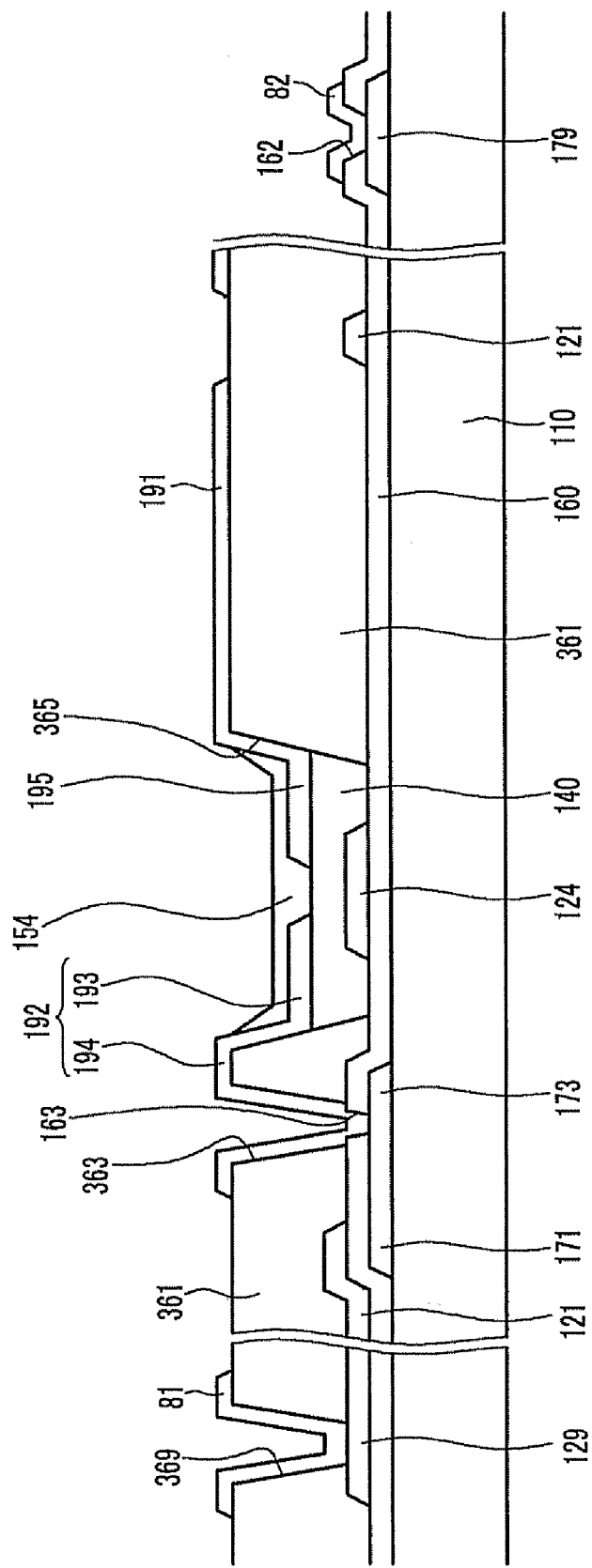
FIG. 18 is a cross-sectional view of the thin film transistor array panel taken along line XVIII-XVIII of FIG. 17.

Next, if a solvent is removed through a drying process, for example, the organic semiconductor 154 is formed in the opening 365, as shown in FIGS. 17 and 18.

Next, as shown in FIGS. 1 and 2, a passivation layer 180 for covering the organic semiconductor 154 is formed by coating an insulating film on the entire surface of the substrate 110 and performing a photolithography process on the insulating film.

By surrounding a gate insulating member and an organic semiconductor with one insulating bank, the number of masks required for forming a separate insulating bank can be reduced and a process margin of inkjet spraying can be increased by performing surface treatment of the insulating bank. Furthermore, by adjusting a shape of an opening of the insulating bank, a solution can be prevented from overflowing and characteristics of a TFT can be prevented from deteriorating.

While the present invention has been described in connection with what is presently considered to be practical exemplary embodiments, it is to be understood that the present invention is not limited to the disclosed exemplary embodiments, but, on the contrary, is intended to cover various modifications and equivalent arrangements included within the spirit and scope of the appended claims.

What is claimed is:

1. A thin film transistor array panel comprising:
    a substrate;
    a data line formed on the substrate;
    a gate line intersecting the data line and which comprises a gate electrode;
    a source electrode connected to the data line;
    a drain electrode opposite to the source electrode;
    an semiconductor in partial contact with the source electrode and the drain electrode;
    a gate insulating member positioned between the gate electrode and the semiconductor; and
    an insulating bank having an opening where the semiconductor and the gate insulating member are positioned,
    wherein the opening has a cross shape in a plane in which a horizontal part and a vertical part of the cross shape intersect.

2. The thin film transistor array panel of claim 1, wherein each of the source electrode and the drain electrode is formed along the vertical part.

3. The thin film transistor array panel of claim 2, wherein the gate insulating member is formed along the horizontal part and the vertical part, and the semiconductor is formed along the vertical part.

4. The thin film transistor array panel of claim 3, wherein the source electrode and the drain electrode comprise indium tin oxide (ITO) or indium zinc oxide (IZO).

5. The thin film transistor array panel of claim 1, wherein a thickness of the insulating bank is larger than a sum of a thickness of the gate insulating member and a thickness of the semiconductor.

6. The thin film transistor array panel of claim 1, wherein the gate insulating member comprise a soluble organic material.

7. The thin film transistor array panel of claim 1, wherein the semiconductor is an organic semiconductor.

8. The thin film transistor array panel of claim 7, wherein the organic semiconductor comprise a soluble organic material.

* * * * *